(12) United States Patent
Lee et al.

(10) Patent No.: US 11,492,519 B2
(45) Date of Patent: Nov. 8, 2022

(54) POLYIMIDE FILM FOR SEMICONDUCTOR PACKAGE

(71) Applicant: IPI TECH INC, Daejeon (KR)

(72) Inventors: Kye Ung Lee, Daejeon (KR); Ju Hwan Chun, Daejeon (KR); Ho Young Park, Daejeon (KR); Tae Seok Lee, Daejeon (KR)

(73) Assignee: IPI TECH INC, Daejeon (KR)

( * ) Notice: Subject to any disclaimer, the term of this patent is extended or adjusted under 35 U.S.C. 154(b) by 0 days.

(21) Appl. No.: 17/274,390

(22) PCT Filed: Jun. 18, 2019

(86) PCT No.: PCT/KR2019/007342
§ 371 (c)(1),
(2) Date: Mar. 8, 2021

(87) PCT Pub. No.: WO2020/050481
PCT Pub. Date: Mar. 12, 2020

(65) Prior Publication Data
US 2022/0049132 A1      Feb. 17, 2022

(30) Foreign Application Priority Data
Sep. 7, 2018   (KR) .......................... 10-2018-0106800

(51) Int. Cl.
*B32B 27/28*       (2006.01)
*C09J 7/38*        (2018.01)
(Continued)

(52) U.S. Cl.
CPC .................. *C09J 7/38* (2018.01); *B32B 7/027* (2019.01); *B32B 27/08* (2013.01); *B32B 27/20* (2013.01);
(Continued)

(58) Field of Classification Search
CPC ....... B32B 7/027; B32B 27/281; C09J 179/08
See application file for complete search history.

(56) References Cited

U.S. PATENT DOCUMENTS

| 6,700,185 B1 | 3/2004 | Kawai et al. |
| 7,057,266 B2 | 6/2006 | Kawai et al. |

(Continued)

FOREIGN PATENT DOCUMENTS

| CN | 1591807 A | 3/2005 |
| CN | 1789361 A | 6/2006 |

(Continued)

OTHER PUBLICATIONS

International Search Report dated Oct. 1, 2019, in connection with corresponding International Patent Application Mo. PCT/KR2019/007342, citing the above references.

(Continued)

*Primary Examiner* — Zachary M Davis
(74) *Attorney, Agent, or Firm* — Hauptman Ham, LLP

(57) ABSTRACT

Disclosed is a semiconductor package polyimide film, which may prevent the stripping of a thermoplastic polyimide layer by reducing a difference in the average coefficient of linear thermal expansion between a substrate film and the thermoplastic polyimide layer, and may be readily detached after a reflow process is completed since the thermoplastic polyimide layer to be attached to a lead frame has a glass transition temperature less than or equal to a reflow process temperature.

7 Claims, 1 Drawing Sheet

(51) Int. Cl.
  *B32B 7/027* (2019.01)
  *B32B 27/08* (2006.01)
  *B32B 27/20* (2006.01)
  *H01L 21/683* (2006.01)

(52) U.S. Cl.
  CPC ........ *B32B 27/281* (2013.01); *H01L 21/6836* (2013.01); *B32B 2307/30* (2013.01); *B32B 2457/14* (2013.01); *C09J 2203/326* (2013.01); *C09J 2301/208* (2020.08); *C09J 2479/08* (2013.01)

(56) References Cited

U.S. PATENT DOCUMENTS

| | | | |
|---|---|---|---|
| 7,378,722 B2 | 5/2008 | Kawai et al. | |
| 7,479,412 B2 | 1/2009 | Kawai et al. | |
| 7,718,258 B2 | 5/2010 | Kodama et al. | |
| 7,843,045 B2 | 11/2010 | Tateoka et al. | |
| 10,077,337 B2 | 9/2018 | Mori et al. | |
| 10,995,179 B2 | 5/2021 | Chiang et al. | |
| 2006/0110595 A1 | 5/2006 | Kodama et al. | |
| 2006/0138616 A1 | 6/2006 | Kawai et al. | |
| 2008/0194062 A1 | 8/2008 | Kawai et al. | |
| 2009/0091012 A1 | 4/2009 | Tateoka et al. | |
| 2011/0033682 A1 | 2/2011 | Shimizu et al. | |
| 2014/0023847 A1* | 1/2014 | Kochiyama | C08G 73/10 428/458 |
| 2016/0369053 A1 | 12/2016 | Chiang et al. | |
| 2017/0321011 A1 | 11/2017 | Mori et al. | |

FOREIGN PATENT DOCUMENTS

| | | |
|---|---|---|
| CN | 106256542 A | 12/2016 |
| CN | 106560320 A | 4/2017 |
| CN | 107312329 A | 11/2017 |
| JP | 9-1723 A | 1/1997 |
| JP | 2003-17644 A | 1/2003 |
| JP | 2003-17648 A | 1/2003 |
| JP | 2003-327932 A | 11/2003 |
| JP | 2005-313407 A | 11/2005 |
| KR | 10-2007-0075356 A | 7/2007 |
| KR | 10-0955552 B1 | 4/2010 |
| KR | 10-2013-0141628 A | 12/2013 |
| KR | 10-2016-0024878 A | 3/2016 |
| KR | 10-1680556 B1 | 11/2016 |
| KR | 10-1696347 B1 | 1/2017 |
| KR | 10-2017-0122661 A | 11/2017 |
| KR | 10-1966958 B1 | 4/2019 |
| WO | 2007/010902 A1 | 1/2007 |

OTHER PUBLICATIONS

Office Action dated Jun. 3, 2022, in connection with Japanese Patent Application No. 2021-512789, along with an English machine translation (7 pages).

Office Action dated Jul. 5, 2022, in connection with Chinese Patent Application No. 201980058580.0, along with an English machine translation (15 pages).

* cited by examiner

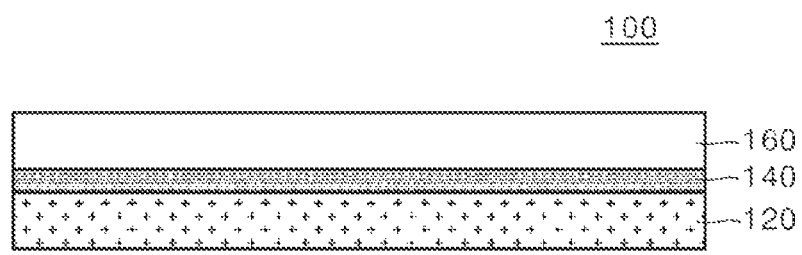

POLYIMIDE FILM FOR SEMICONDUCTOR PACKAGE

CROSS-REFERENCE TO RELATED APPLICATION

The present application is a national stage filing under 35 U.S.C § 371 of PCT application number PCT/KR2019/007342 filed on Jun. 18, 2019 which is based upon and claims the benefit of priorities to Korean Patent Application No. 10-2018-0106800, filed on Sep. 7, 2018, in the Korean Intellectual Property Office, which are incorporated herein in their entireties by reference.

TECHNICAL FIELD

The present disclosure relates to a polyimide film for a semiconductor package, and more specifically, relates to a polyimide film for a semiconductor package in which a difference between average coefficients of linear thermal expansions of a base film and a thermoplastic polyimide layer is lowered such that peeling of the thermoplastic polyimide layer may be prevented, and in which the thermoplastic polyimide layer attached to a lead frame has a glass transition temperature below a packaging process temperature, thereby enabling easy peeling after the encapsulation process is completed.

DESCRIPTION OF RELATED ART

A polyimide film has excellent mechanical and thermal dimensional stability and chemical stability, and thus is widely used in electric, electronic material, space, aviation, and telecommunication fields. This polyimide film is widely used as a material for a flexible circuit board having a fine pattern due to lightness, thinness, shortness and smallness of a part, for example, as a material for a base film such as TAB (Tape Automated Bonding) or COF (Chip On Film).

Further, a semiconductor package having a structure in which only one face (semiconductor device) of the semiconductor package is encapsulated, and an exposed lead frame on an opposite face is used for connection to an external component is being developed. In the semiconductor package with such a structure, the lead frame does not protrude from an encapsulation resin, and thus, lightness, thinness, shortness and smallness of the package may be achieved. However, defects may occur in which the encapsulation resin invades a backside of the lead frame during encapsulation of the semiconductor package.

Accordingly, after attaching an adhesive film to the lead frame before the encapsulation of the semiconductor package, the encapsulation process is performed, and then the adhesive film is peeled from the lead frame, thereby preventing the encapsulation resin from invading the backside of the lead frame.

This adhesive film generally has a structure in which a thermoplastic polyimide layer to be attached to the lead frame is laminated on a base film.

In this connection, the encapsulation process performed after attaching the adhesive film on the back side of the lead frame is performed at a relatively high temperature (for example, 200° C. or higher). During the encapsulation process, the thermoplastic polyimide layer is peeled from the base film or the thermoplastic polyimide layer is denatured, so that the adhesive film is not easily peeled from the lead frame after the encapsulation.

DISCLOSURE

Technical Purpose

Under the above technical background, a purpose of the present disclosure is to provide a polyimide film for a semiconductor package in which a difference between average coefficients of linear thermal expansions of a base film and a thermoplastic polyimide layer laminated on the base film is lowered, thereby preventing peeling of the thermoplastic polyimide layer at high temperatures.

Further, a purpose of the present disclosure is to provide a polyimide film for a semiconductor package in which the thermoplastic polyimide layer attached to a lead frame has a glass transition temperature below an encapsulation process temperature, thereby achieving easy peeling after the packaging process is completed.

Technical Solution

In order to achieve the above technical purposes, according to one aspect of the present disclosure, a polyimide film for a semiconductor package including a base film, a non-thermoplastic polyimide layer positioned on the base film, and a thermoplastic polyimide layer positioned on the non-thermoplastic polyimide layer is provided.

In this connection, the non-thermoplastic polyimide layer may reduce the difference between the average coefficients of linear thermal expansions of the base film and the thermoplastic polyimide layer and thus may serves as an average coefficient of linear thermal expansion compensation layer, thereby to prevent peeling of the thermoplastic polyimide layer from the base film.

In order for the non-thermoplastic polyimide layer to act as the average coefficient of linear thermal expansion compensation layer between the base film and the thermoplastic polyimide layer, the non-thermoplastic polyimide layer also has a small difference in the average coefficient of linear thermal expansion from that of the base film such that during a high temperature process, the non-thermoplastic polyimide layer may not peel from the base film.

To this end, it is preferable that the difference between the average coefficients of linear thermal expansions of the base film and the non-thermoplastic polyimide layer at 20° C. to 200° C. is 30 ppm/K or lower.

Further, in order to reduce the possibility of peeling of the thermoplastic polyimide layer from the non-thermoplastic polyimide layer, the difference between the average coefficients of linear thermal expansions between the non-thermoplastic polyimide layer and the thermoplastic polyimide layer at 20° C. to 200° C. is preferably 30 ppm/K or lower.

Technical Effects

According to the present disclosure, reducing the difference between the average coefficients of linear thermal expansions of the base film and the thermoplastic polyimide layer laminated on the base film may prevent the peeling of the thermoplastic polyimide layer at high temperatures.

Further, since the thermoplastic polyimide layer attached to the lead frame has a glass transition temperature below the encapsulation process temperature, easy peeling thereof is possible after the packaging process is completed.

Further, when attaching to the lead frame, and when the difference between the average coefficients of linear thermal expansions of the thermoplastic polyimide layer and the base film is large, lead frame warpage may occur. However, according to the present disclosure, it is possible to reduce the lead frame warpage or the peeling of the polyimide film by reducing the difference in the average coefficient of linear thermal expansion due to the presence of the non-thermoplastic polyimide layer.

BRIEF DESCRIPTIONS OF DRAWINGS

FIG. 1 schematically shows a cross-section of a polyimide film for a semiconductor package according to one embodiment of the present disclosure.

DETAILED DESCRIPTIONS

For easier understanding of the present disclosure, specific terms are defined herein for convenience. Unless otherwise defined herein, scientific terms and technical terms used in the present disclosure will have meanings commonly understood by those of ordinary skill in the relevant technical field. Further, unless otherwise specified in context, a term in a singular form includes a plural form thereof or vice versa.

Hereinafter, a polyimide film for a semiconductor package according to the present disclosure will be described in more detail.

FIG. 1 is a cross-sectional view showing a polyimide film for a semiconductor package according to one embodiment of the present disclosure.

Referring to FIG. 1, a polyimide film 100 for a semiconductor package according to one embodiment of the present disclosure includes a base film 120, the non-thermoplastic polyimide layer 140 on the base film 120, and a thermoplastic polyimide layer 160 on the non-thermoplastic polyimide layer 140.

In this connection, the base film 120 is preferably a film made of a material capable of securing heat resistance in order to prevent modification at high temperatures applied during a manufacturing process of a semiconductor package.

A material used for forming this base film 120 includes resins such as polyimide, polyamideimide, polysulfone, polyethersulfone, polyphenylenesulfide, polyetherketone, polyarylate, polyetheretherketone and polyethylenenaphthalate.

The material of the base film 120 to implement the polyimide film 100 for the semiconductor package according to one embodiment of the present disclosure may include a material other than the above-described various resins. The base film 120 formed using such a resin is preferably formed to have an average coefficient of linear thermal expansion of 20 ppm/K or lower at 20° C. to 200° C.

When the average coefficient of linear thermal expansion of the base film 120 is greater than 20 ppm/K at 20° C. to 200° C., there is a risk of the lead frame warpage or the peeling of the polyimide film therefrom due to the difference between the average coefficients of linear thermal expansions of the lead frame and the polyimide film.

Further, it is preferable that a glass transition temperature of the base film 120 is at least 150° C. to secure heat resistance of the polyimide film 100.

A thickness of the base film 120 is not particularly limited. However, in order to prevent burrs from occurring in the lead frame after attaching the polyimide film 100 to the lead frame, it is desirable that the base film 120 has a thickness of 150 µm or smaller.

Further, a surface of the base film 120 in contact with the non-thermoplastic polyimide layer 140 may be surface-treated in order to increase adhesion thereof to the non-thermoplastic polyimide layer 140.

This surface treatment may change a surface roughness of the base film 120. A treatment method that changes the surface roughness of the film may include chemical treatment, physical treatment, plasma treatment, or corona treatment.

In this connection, the non-thermoplastic polyimide layer 140 reduces the difference between the average coefficients of linear thermal expansions of the base film 120 and the thermoplastic polyimide layer 160 and thus serves as the average coefficient of linear thermal expansion compensation layer, thereby preventing the peeling of the thermoplastic polyimide layer 160 from the base film 120.

A material used for forming the non-thermoplastic polyimide layer 140 may include a thermosetting polyimide resin, but is not necessarily limited thereto. The non-thermoplastic polyimide layer 140 may be formed by mixing a thermoplastic polyimide resin with a thermosetting resin such as, for example, a phenol resin.

Further, in order for the non-thermoplastic polyimide layer 140 to serve as the average coefficient of linear thermal expansion compensation layer between the base film 120 and the thermoplastic polyimide layer 160, the non-thermoplastic polyimide layer 140 also has a small difference in the average coefficient of linear thermal expansion from that of the base film, so that the non-thermoplastic polyimide layer 140 may not peel from the base film 120 during a high temperature process.

To this end, the non-thermoplastic polyimide layer 140 has an average coefficient of linear thermal expansion of 40 ppm/K or lower at 20° C. to 200° C. It is desirable that the difference of the average coefficients of linear thermal expansions of the non-thermoplastic polyimide layer 140 and the base film 120 is lower than or equal to 30 ppm/K at 20° C. to 200° C.

When the difference of the average coefficients of linear thermal expansions of the non-thermoplastic polyimide layer 140 and the base film 120 is lower than or equal to 30 ppm/K at 20° C. to 200° C., the possibility of the peeling of the non-thermoplastic polyimide layer 140 from the base film 120 during die attach and wiring processes at high temperature (e.g., 200° C. or higher) as performed after attaching the polyimide film 100 on the back side of the lead frame may be lowered.

Further, it is preferable that the non-thermoplastic polyimide layer 140 has an adhesive strength at 25° C. lower than or equal to 10 gf/cm to the lead frame.

The non-thermoplastic polyimide layer 140 does not directly bond to the lead frame. However, a portion of the non-thermoplastic polyimide layer 140 may be exposed because the thermoplastic polyimide layer 160 is not completely laminated on the non-thermoplastic polyimide layer 140.

However, even when the exposed portion of the non-thermoplastic polyimide layer 140 adheres to the lead frame, the non-thermoplastic polyimide layer 140 has lower adhesion to the lead frame and thus does not affect the peeling of the polyimide film 100 from the lead frame after the encapsulation process.

A thickness of the above-described non-thermoplastic polyimide layer 140 is not particularly limited. However, it is preferable that the above-described non-thermoplastic polyimide layer 140 has a thickness of 0.3 µm to 5 µm to prevent bouncing during the wiring process in the semiconductor package process.

Further, it is preferable that the non-thermoplastic polyimide layer 140 has a glass transition temperature of 320° C. or higher to prevent the non-thermoplastic polyimide layer 140 from becoming flexible during the high-temperature encapsulation process.

When the glass transition temperature of the non-thermoplastic polyimide layer 140 is lower than 320° C., an interface between the non-thermoplastic polyimide layer and the thermoplastic polyimide layer is changed during a high-temperature process such as a reflow process, and thus the adhesion thereof to the lead frame increases, such that foreign matters may remain when the film is removed from the lead frame.

Further, as the warpage of the lead frame increases in the high-temperature process after bonding the lead frame thereto, such that the non-thermoplastic polyimide layer 140 may be peeled from the base film 100, or the non-thermoplastic polyimide layer 140 and the thermoplastic polyimide layer 160 may be peeled from the base film 100, such that the polyimide film 100 may not be completely attached to the lead frame.

In one example, the thermoplastic polyimide layer 160 is located on the non-thermoplastic polyimide layer 140.

The thermoplastic polyimide layer 140 may be formed using a resin containing a polyamic acid prepared by synthesizing an aromatic diamine containing at least one functional group selected from an ether group, a ketone group and a methyl group, and an aromatic dianhydride containing at least one functional group selected from an ether group, a ketone group and a methyl group with an organic solvent.

In this connection, the aromatic diamine may include 3,3'-dimethyl-[1,1'-biphenyl]-4,4'-diamine represented by a following Chemical Formula 1.

[Chemical Formula 1]

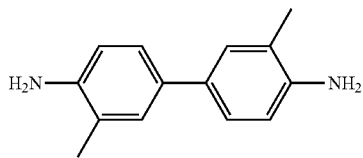

Further, the aromatic dianhydride may include 3,3',4,4'-benzophenontetracarbolxylic dianhydride represented by a following Chemical Formula 2.

[Chemical Formula 2]

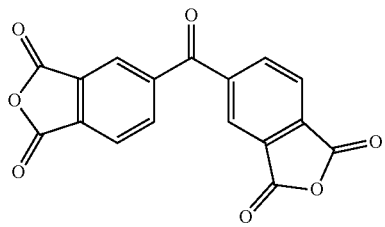

The organic solvent may include at least one selected from NMP (N-methyl-2-pyrrolidone), DMAC (dimethylacetamide), DMF (dimethylformamide), dimethyl sulfoxide and ethyl lactate. The disclosure is not necessarily limited thereto.

Further, additionally, the resin used for forming the thermoplastic polyimide layer 140 may further contain 5 to 20 parts by weight of an inorganic filler based on 100 parts by weight of the resin.

When the inorganic filler is contained in the thermoplastic polyimide layer 140, the adhesion between the non-thermoplastic polyimide layer 140 and the thermoplastic polyimide layer 160 may be improved, such that the problem of the peeling of the thermoplastic polyimide layer 160 from the non-thermoplastic polyimide layer 140 may be prevented. Further, the inorganic filler reduces the difference between the average coefficients of linear thermal expansions of the thermoplastic polyimide layer 160 and the non-thermoplastic polyimide layer 140, thereby preventing the peeling of the thermoplastic polyimide layer 160 from the non-thermoplastic polyimide layer 140 during the high temperature process. Further, when the inorganic filler is contained in the thermoplastic polyimide layer 140, the adhesion between the thermoplastic polyimide layer 140 and the lead frame may be controlled.

Non-limiting examples of the inorganic filler used in the present disclosure may include $SiO_2$, $Al_2O_3$ or ZnO, etc. An average diameter of the inorganic filler may be 1 Å to 100 nm.

The polyimide film 100 for the semiconductor package according to one embodiment of the present disclosure includes the non-thermoplastic polyimide layer 140 interposed between the base film 120 and the thermoplastic polyimide layer 160. In this connection, the non-thermoplastic polyimide layer 140 has an average coefficient of linear thermal expansion between those of the base film 120 and the thermoplastic polyimide layer 160, thereby reducing ab abrupt change in the average coefficient of linear thermal expansion across the polyimide film 100.

The thermoplastic polyimide layer 160 may have an average coefficient of linear thermal expansion of 40 ppm/K to 50 ppm/K at 20° C. to 200° C. In particular, to avoid the peeling thereof from the non-thermoplastic polyimide layer 140 during the high temperature process, The average coefficient of linear thermal expansion of the thermoplastic polyimide layer 160 positioned on the non-thermoplastic polyimide layer 140 may be controlled such that the difference between the average coefficients of linear thermal expansions between the non-thermoplastic polyimide layer 140 and the thermoplastic polyimide layer 160 at 20° C. to 200° C. is preferably 30 ppm/K or lower.

Further, since the thermoplastic polyimide layer 160 has a glass transition temperature of 190° C. to 230° C., the thermoplastic polyimide layer 160 becomes flexible like a rubber during the high-temperature encapsulation process, thereby improving adhesion thereof to the lead frame.

Further, it is preferable that the thermoplastic polyimide layer 160 has an adhesive strength thereof at 25° C. of 50 gf/cm to 200 gf/cm to the lead frame.

The thermoplastic polyimide layer 160 directly adheres to the lead frame. when the adhesion strength thereof at 25° C. to the lead frame is lower than 50 gf/cm, the adhesion thereof to the lead frame is low, resulting in epoxy leakage and burrs during an epoxy mold injection. When the adhesion thereof to the lead frame at 25° C. is greater than 200 gf/cm, the adhesion thereof to the lead frame is excessively high, such that there is a concern that residues may remain when peeling the polyimide film 100 from the lead frame after the encapsulation.

A thickness of the thermoplastic polyimide layer 160 as described above is not particularly limited. However, the thickness of the thermoplastic polyimide layer 160 is 0.3 μm to 5 μm in order to prevent occurrence of bending in the polyimide film 100 due to a volume change of the thermoplastic polyimide layer 160 according to the temperature change.

Hereinafter, specific examples of the present disclosure are presented. However, the following examples are only to specifically illustrate or explain the present disclosure and should not limit the present disclosure.

Manufacturing Method of Polyimide Film

Example 1

A non-thermoplastic polyimide resin (resin A) was polymerized using 4,4'-diaminodiphenyl ether and pyromellitic acid dianhydride. A resin (resin B) used for forming a thermoplastic polyimide layer was synthesized using 1,3-bis(4-aminophenoxy)benzene, 3,3',4,4'-benzophenone dianhydride, and 4,4'-oxydiphthalic anhydride and then was composited by adding 15% by mass of silica to the resin B based on a total mass of the resin B.

A GF100 (SKCKolonPI) film having a 100 μm thickness and an average coefficient of linear thermal expansions of 17 ppm/K at 20° C. to 200° C. was used as the base film. The resin A was applied on one face of the base film to a thickness of 2 μm and then heat treated at 300° C. to form the non-thermoplastic polyimide layer.

In this connection, the average coefficient of linear thermal expansions of the non-thermoplastic polyimide layer at 20° C. to 200° C. was 30 ppm/K.

Subsequently, the resin B was applied on the non-thermoplastic polyimide layer to a thickness of 1 μm, followed by heat treatment at 300° C. to form the thermoplastic polyimide layer to manufacture the polyimide film.

In this connection, the glass transition temperature of the thermoplastic polyimide layer was 200° C., and the average coefficient of linear thermal expansion thereof at 20° C. to 200° C. was 40 ppm/K.

Example 2

A non-thermoplastic polyimide resin (resin A) was polymerized using 4,4'-diaminodiphenyl ether and pyromellitic acid dianhydride. A resin (resin B) used for forming a thermoplastic polyimide layer was synthesized using 1,3-bis(4-aminophenoxy)benzene, 3,3',4,4'-benzophenone dianhydride, and 4,4'-oxydiphthalic anhydride.

A GF100 (SKCKolonPI) film having a 100 μm thickness and an average coefficient of linear thermal expansions of 17 ppm/K at 20° C. to 200° C. was used as the base film. The resin A was applied on one face of the base film to a thickness of 2 μm and then heat treated at 300° C. to form the non-thermoplastic polyimide layer.

In this connection, the average coefficient of linear thermal expansions of the non-thermoplastic polyimide layer at 20° C. to 200° C. was 30 ppm/K.

Subsequently, the resin B was applied on the non-thermoplastic polyimide layer to a thickness of 1 μm, followed by heat treatment at 300° C. to form the thermoplastic polyimide layer to manufacture the polyimide film.

In this connection, the glass transition temperature of the thermoplastic polyimide layer was 200° C., and the average coefficient of linear thermal expansion thereof at 20° C. to 200° C. was 60 ppm/K.

Example 3

A polyimide film was manufactured in the same manner as in Example 2, except that the average coefficient of linear thermal expansion at 20° C. to 200° C. of the base film was 10 ppm/K.

Comparative Example 1

A polyimide film was manufactured in the same manner as in Example 1, except that the average coefficient of linear thermal expansion at 20° C. to 200° C. of the thermoplastic polyimide layer was 90 ppm/K and the thermoplastic polyimide layer had the glass transition temperature of 180° C.

Comparative Example 2

A polyimide film was manufactured in the same manner as in Example 1, except that the thermoplastic polyimide layer was directly formed on the base film without forming the non-thermoplastic polyimide layer on the base film.

Residue Evaluation for Polyimide Film

Residue Evaluation Method

In order to evaluate the heat resistance of the polyimide film, after attaching the polyimide film to the back side of the lead frame of the semiconductor package, heat treatment was conducted at 190° C. for 5 minutes, 260° C. for 1 minute, and 175° C. for 3 minutes step by step, and the polyimide film was removed from the lead frame, and then an amount of the residue remaining on the lead frame surface was checked using a microscope.

Residue Evaluation Score

○: A residue area is within 5% of a total area of a lead frame surface

Δ: A residue area is within 5 to 30% of a total area of a lead frame surface

X: A residue area is above 30% of a total area of a lead frame surface

TABLE 1

| Examples | Residue evaluation result |
|---|---|
| Example 1 | ○ |
| Example 2 | ○ |
| Example 3 | Δ |
| Comparative Example 1 | X |
| Comparative Example 2 | X |

One embodiment of the present disclosure has been described above. When a person with ordinary knowledge in the relevant technical field may make addition, modification, and deletion of a component within the scope not departing from the spirit of the present disclosure based on the claims. The addition, modification, and deletion may be included within the scope of the present disclosure.

What is claimed is:

1. A polyimide film for a semiconductor package comprising:
    a base film;
    a non-thermoplastic polyimide layer disposed on the base film; and
    a thermoplastic polyimide layer disposed on the non-thermoplastic polyimide layer,
    wherein a difference between average coefficients of linear thermal expansions at 20° C. to 200° C. of the base film and the non-thermoplastic polyimide layer is 15 ppm/K or lower, wherein the thermoplastic polyimide layer contains an inorganic filler, wherein a content of the inorganic filler is in a range of 5 to 20 parts by weight based on 100 parts by weight of a resin of the thermoplastic polyimide layer, wherein an adhesion at 25° C. of the non-thermoplastic polyimide layer to a lead frame is lower than 10 gf/cm, wherein an adhesion at 25° C. of the thermoplastic polyimide layer to the lead frame is in a range of 50 gf/cm to 200 gf/cm.

2. The polyimide film for the semiconductor package of claim 1, wherein a difference between average coefficients of linear thermal expansions at 20° C. to 200° C. of the non-thermoplastic polyimide layer and the thermoplastic polyimide layer is 30 ppm/K or lower.

3. The polyimide film for the semiconductor package of claim 1, wherein an average coefficient of linear thermal expansion at 20° C. to 200° C. of the base film is lower than or equal to 20 ppm/K, wherein an average coefficient of linear thermal expansion at 20° C. to 200° C. of the non-thermoplastic polyimide layer is 30 ppm/K or lower.

4. The polyimide film for the semiconductor package of claim 1, wherein an average coefficient of linear thermal expansion at 20° C. to 200° C. of the thermoplastic polyimide layer is in a range of 40 ppm/K to 50 ppm/K.

5. The polyimide film for the semiconductor package of claim 1, wherein the on-thermoplastic polyimide layer has a glass transition temperature of 320° C. or higher.

6. The polyimide film for the semiconductor package of claim 1, wherein the thermoplastic polyimide layer has a glass transition temperature of 190° C. to 230° C.

7. The polyimide film for the semiconductor package of claim 1, wherein a surface of the base film in contact with the non-thermoplastic polyimide layer is surface-treated to increase adhesion thereof to the non-thermoplastic polyimide layer.

* * * * *